(12) United States Patent
Baumgarte et al.

(10) Patent No.: US 10,550,601 B2
(45) Date of Patent: Feb. 4, 2020

(54) METHOD AND APPARATUS TO DETERMINE A CONDITION OF A DOOR

(71) Applicant: Schlage Lock Company LLC, Carmel, IN (US)

(72) Inventors: Joseph W. Baumgarte, Carmel, IN (US); James D. Ohl, Colorado Springs, CO (US); Jonathan Everson, Kokomo, IN (US); Abdul Khadar Jailani Mannanayak, Bangalore (IN)

(73) Assignee: Schlage Lock Company LLC, Carmel, IN (US)

( * ) Notice: Subject to any disclaimer, the term of this patent is extended or adjusted under 35 U.S.C. 154(b) by 0 days.

(21) Appl. No.: 15/668,187

(22) Filed: Aug. 3, 2017

(65) Prior Publication Data
US 2019/0040653 A1    Feb. 7, 2019

(51) Int. Cl.
*E05B 17/22*    (2006.01)
*E05B 17/02*    (2006.01)
(Continued)

(52) U.S. Cl.
CPC ............ *E05B 17/22* (2013.01); *E05B 47/023* (2013.01); *G01B 7/24* (2013.01); *E05B 2045/0665* (2013.01); *E05B 2045/0685* (2013.01); *E05B 2047/0068* (2013.01); *E05B 2047/0069* (2013.01); *H05K 2201/10598* (2013.01)

(58) Field of Classification Search
CPC .................. E05B 17/22; E05B 47/023; E05B 2045/0665; E05B 2045/0685; E05B 2047/0068; E05B 2047/0069; E05B 45/06; E05B 45/083; G01B 7/14; G01B 7/24
See application file for complete search history.

(56) References Cited

U.S. PATENT DOCUMENTS 5,862,691 A * 1/1999 Friedrich ................ E05B 17/22
                                                         340/426.28
5,865,049 A * 2/1999 Friedrich ................ E05B 17/22
                                                         340/426.28
(Continued)

FOREIGN PATENT DOCUMENTS

DE    102012025474 A1    7/2014
EP    0743410 A2 *    11/1996    ........... E05B 45/083
(Continued)

*Primary Examiner* — Adnan Aziz
(74) *Attorney, Agent, or Firm* — Taft Stettinius & Hollister LLP

(57) ABSTRACT

A lock assembly for a door, the lock assembly including a first magnetic field sensor and a second magnetic field sensor. The first magnetic field sensor and the second magnetic field sensor are moveable with respect to the door to determine an open position of the door, a close position of the door, and a fault condition. In one embodiment, the first magnetic field sensor and the second magnetic field sensor move with respect to the door as the door moves from the open position and the close position. The first magnetic field sensor is spaced from the second magnetic field sensor such that each of the first and second magnetic field sensors detects a different value of magnetic field intensity. A controller determines a position of the door with respect to a door frame using signals provided by the first and second magnetic field sensors.

25 Claims, 9 Drawing Sheets

(51) Int. Cl.
 *G01B 7/24* (2006.01)
 *E05B 47/02* (2006.01)
 *E05B 47/00* (2006.01)
 *E05B 45/06* (2006.01)

(56) References Cited

U.S. PATENT DOCUMENTS

| | | | | |
|---|---|---|---|---|
| 6,022,056 | A * | 2/2000 | Cope | E05B 17/22 |
| | | | | 292/144 |
| 8,495,836 | B2 * | 7/2013 | Lowder | E05B 65/1053 |
| | | | | 292/92 |
| 8,820,803 | B2 | 9/2014 | Hunt et al. | |
| 9,663,966 | B1 * | 5/2017 | Wallace | E05B 1/0007 |
| 2001/0050486 | A1 * | 12/2001 | Bunting | E05C 17/48 |
| | | | | 292/342 |
| 2004/0021568 | A1 * | 2/2004 | Seal | G01R 22/066 |
| | | | | 340/551 |
| 2007/0069894 | A1 * | 3/2007 | Lee | E05B 45/06 |
| | | | | 340/542 |
| 2007/0139195 | A1 * | 6/2007 | Jin | G08B 13/08 |
| | | | | 340/547 |
| 2009/0090148 | A1 * | 4/2009 | Kollin | E05B 45/083 |
| | | | | 70/263 |
| 2009/0102653 | A1 * | 4/2009 | McGinnis | E05B 45/06 |
| | | | | 340/551 |
| 2009/0140858 | A1 * | 6/2009 | Gore | G08B 13/04 |
| | | | | 340/547 |
| 2010/0290542 | A1 * | 11/2010 | Peabody | E05B 17/22 |
| | | | | 375/258 |
| 2012/0167646 | A1 * | 7/2012 | Sharma | G01B 7/31 |
| | | | | 70/280 |
| 2012/0299314 | A1 * | 11/2012 | Jiang | E05B 45/083 |
| | | | | 292/137 |
| 2014/0062466 | A1 * | 3/2014 | Thibault | G01B 7/14 |
| | | | | 324/207.22 |
| 2014/0292001 | A1 | 10/2014 | Nunez et al. | |
| 2015/0330140 | A1 * | 11/2015 | Kincaid | E06B 7/28 |
| | | | | 324/207.12 |
| 2016/0027272 | A1 * | 1/2016 | Carlson | G08B 13/2491 |
| | | | | 340/551 |
| 2016/0130840 | A1 * | 5/2016 | Garneau | E05B 47/0012 |
| | | | | 292/201 |
| 2016/0290005 | A1 | 10/2016 | Goldenson | |
| 2016/0319570 | A1 * | 11/2016 | Wong | E05B 43/005 |
| 2017/0052043 | A1 * | 2/2017 | Hernandez-Oliver | |
| | | | | G01D 5/2006 |
| 2017/0098356 | A1 * | 4/2017 | Dai | G08B 13/2491 |
| 2018/0051479 | A1 * | 2/2018 | Suarez Lainez | E05B 17/22 |
| 2018/0155959 | A1 * | 6/2018 | Hartung | E05B 63/0017 |
| 2019/0234110 | A1 * | 8/2019 | Laporta | E05B 7/00 |

FOREIGN PATENT DOCUMENTS

EP            2383409 A2    11/2011
WO       2012092492 A2    7/2012

\* cited by examiner

METHOD AND APPARATUS TO DETERMINE A CONDITION OF A DOOR

TECHNICAL FIELD

The present invention generally relates to door position sensing, and more particularly, but not exclusively, to a sensor assembly which detects a position of a door.

BACKGROUND

Lock assemblies are commonly installed on doors to control access to a secured region or environment, and often include handles on opposing sides of the door which can be actuated to retract a latch bolt. In certain settings, it is desirable to determine the state of the door and/or the lock assembly and to record data regarding the operation thereof. Some lock systems have certain limitations, such as those relating to independently or selectively monitoring operation of the handles, the lock system, and the door. Additionally, with the expanding use of electronic lock systems, the use of different types of mechanisms to defeat the lock system has become more widespread. Therefore, there is a need for further improvements in systems and methods for monitoring conditions of a lock assembly and the location of a door with respect to a door frame.

SUMMARY

In one embodiment, there is provided a lock assembly for a door including a deadlatch assembly having a first magnetic field sensor and a second magnetic field sensor spaced from the first magnetic field sensor. The deadlatch assembly is configured to move from an extended position to a retracted position A controller is operatively connected to the first magnetic field sensor and the second magnetic field sensor, wherein the controller is configured to execute stored program instructions to: determine a first magnetic field signal strength provided by a magnetic field; determine a second magnetic field signal strength provided by the magnetic field; and determine the status of one of the lock assembly or the door, wherein the status includes an open position and a close position In another embodiment, there is provided a mortise lock assembly including a key cylinder, a case, a latchbolt configured to move with respect to the case, and a deadlatch assembly configured to move with respect to the case. A screw assembly is configured to retain the key cylinder in the case, wherein the screw assembly includes a screw defining a channel. A flexible PCBA is located in the channel of the screw, wherein the flexible PCBA includes a first magnetic field sensing device located at a first position closest to a screw drive of the screw assembly and a second magnetic field sensing device located at a second position further from the screw drive than the first magnetic field sensing device.

In still another embodiment, there is provided a method of determining the position of a door with respect to a door frame includes the steps of: moving a first magnetic field sensor and a second magnetic field sensor simultaneously along an axis defined with respect to a plane of the door; identifying a first magnetic field with the first magnetic field sensor and a second magnetic field with the second magnetic field sensor; providing an indicator based on the identified first magnetic field and the identified second magnetic field, wherein the indicator shows one of an open door position and a close door position.

BRIEF DESCRIPTION OF THE FIGURES

The above-mentioned aspects of the present invention and the manner of obtaining them will become more apparent and the invention itself will be better understood by reference to the following description of the embodiments of the invention, taken in conjunction with the accompanying drawings, wherein.

DETAILED DESCRIPTION OF ILLUSTRATIVE EMBODIMENTS

Figure 1:
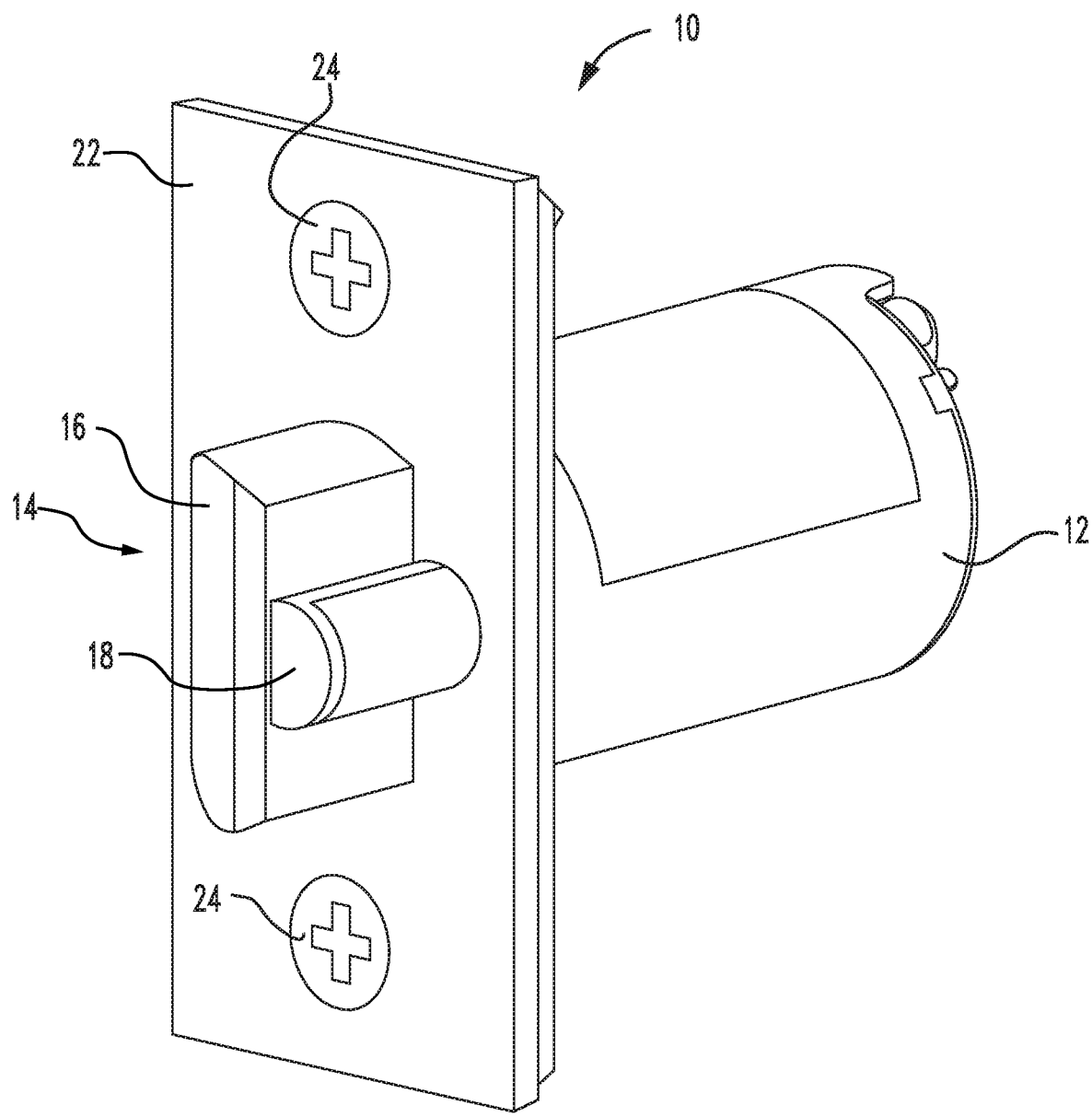
FIG. 1 is a perspective view of a cylindrical latch assembly according to one embodiment.

For the purposes of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

FIG. 1 illustrates a perspective view of a cylindrical latch assembly 10 according to one embodiment of the present invention. The latch assembly 10 includes a lock cylinder 12 which is operatively connected to a door handle, which may include a key lock as is known by those skilled in the art. The latch assembly 10 is mounted in a cavity located in a door (not shown) as is understood by those skilled in the art. The latch assembly 10 includes a latch 16, also known as a dead latch assembly, and a dead latch plunger 18, both of which extend through a retaining plate 22. The lock assembly 10 is located within the cavity of the door and is coupled to the door with the retaining plate 22, which is mounted to an end of the door with one or more retaining couplers 24. The dead latch 16 and dead latch plunger 18 interface with a strike plate (not shown) located at a door frame or other latch engaging structure. When the dead latch assembly 16 and dead latch plunger 18 engage an aperture defined in the strike plate, the door is prevented from being opened unless the dead latch 16 is retracted from the strike plate. Retraction of the dead latch 16 is made, in different embodiments, by movement of the door handle, by movement of a key within a door lock cylinder, or by an electronic signal which retracts the latch assembly.

The cylindrical latch assembly 10 includes a magnetic field sensing device adapted to sense the presence of a magnetic field generating device as described herein. In one embodiment, a magnetic field generating device 25 (see FIG. 2) is located in a structure adjacent to the door such as a door jamb, a door frame, or other location external to the door which is sufficiently close to the latch assembly 10, for the latch assembly to sense the generated magnetic field when the door is in a closed position. In different embodiments, the magnetic field generating device 25 is a permanent magnet or an electromagnet, each of which generates magnetic fields, the strength of which decreases as the distance from the magnetic field generating device 25 increases. In some embodiments, it should be appreciated that the magnetic field generating device 25 may include multiple components (e.g., multiple permanent magnets and/or electromagnets).

Figure 2:
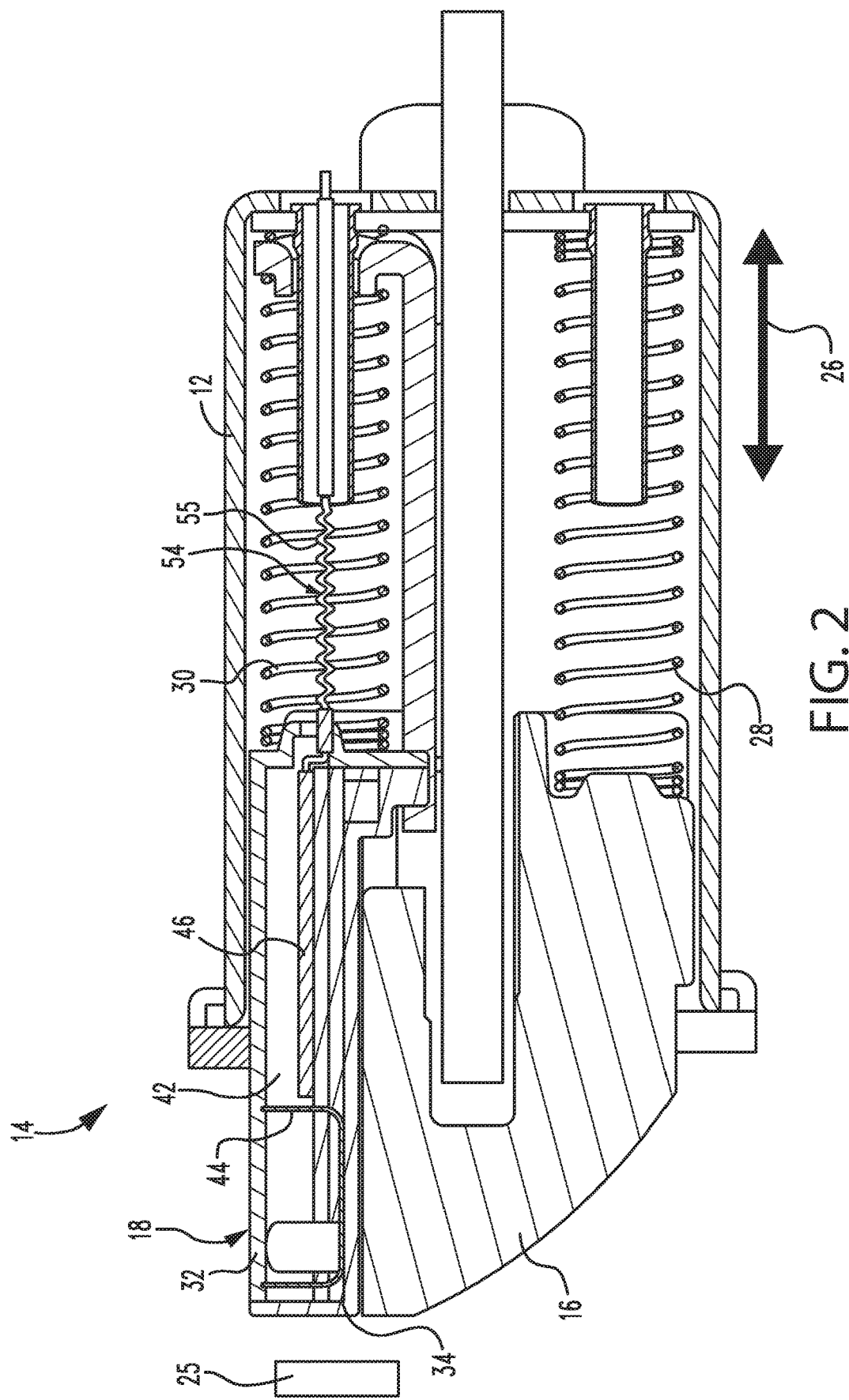
FIG. 2 is a sectional view of the cylindrical assembly of FIG. 1.

FIG. 2 illustrates a sectional view of the cylindrical latch assembly 10 of FIG. 1. The latch components are located within the lock cylinder 12, wherein the latch 16 and deadlatch plunger 18 each move along a longitudinal direction 26. The latch 16 is biased by a spring 28 to extend the latch 16 from the cylinder 12. Likewise, the deadlatch plunger 18 is biased by a spring 30 to extend the plunger 18 from the cylinder 12. The present disclosure is not limited to a spring 30, but other mechanisms of spring biasing are contemplated.

Figure 3:
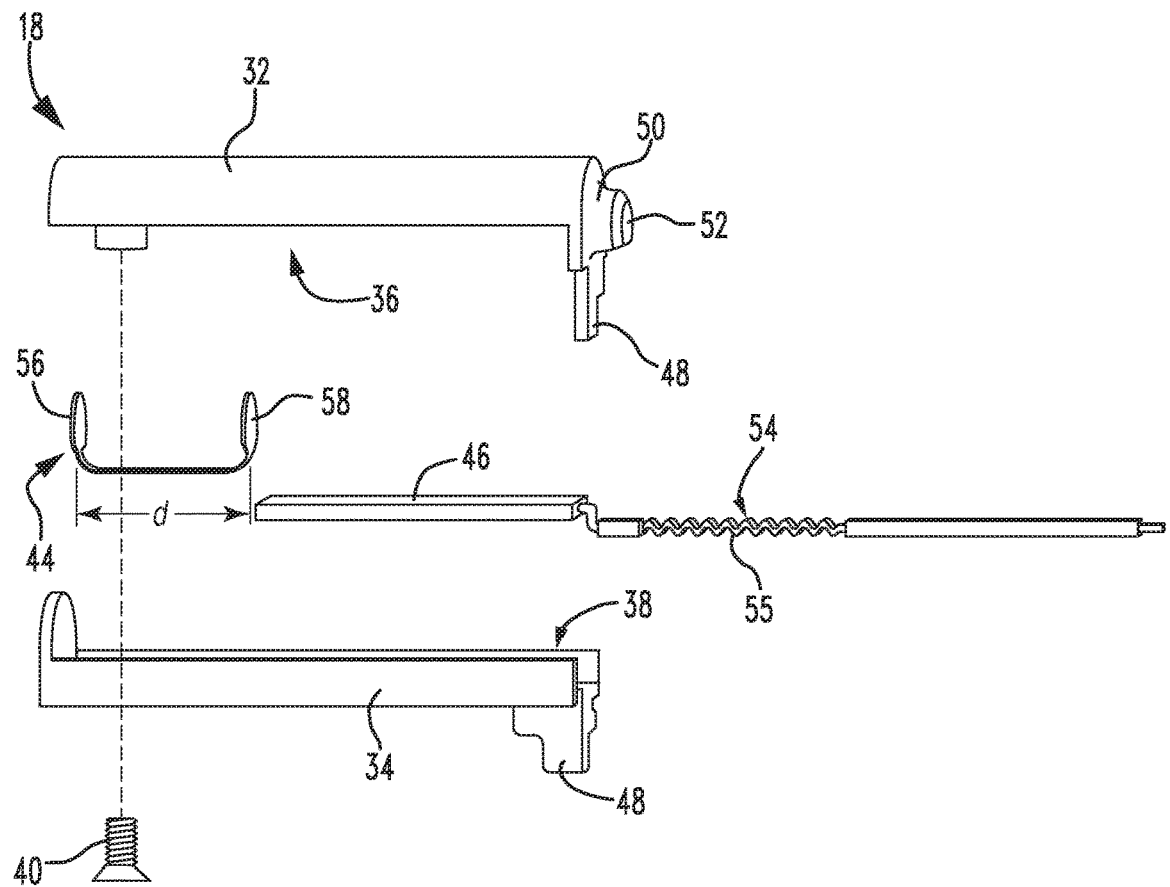
FIG. 3 is an exploded view of one embodiment of a split deadlatch plunger assembly of FIG. 2.

Referring to both FIG. 2 and FIG. 3, the deadlatch plunger 18 includes a top portion 32 and a bottom portion 34 that define, respectively, a cavity 36 and a cavity 38. In the illustrative embodiment, the top portion 32 is configured to be coupled to the bottom portion 34 via one or more couplers 40 (e.g., one or more screws, bolts, locking mechanisms, etc.). When the top portion 32 is coupled to the bottom portion 34 with the coupler(s) 40, an enclosed chamber 42 (see FIG. 2) is provided to hold a flexible printed circuit board assembly (PCBA) 44 and a current measuring circuit board 46. In another embodiment, the PCBA 44 and current measuring circuit board 46 are configured on a single circuit board. Each of the top portion 32 and the bottom portion 34 includes a length which extends longitudinally along the direction 26. A guide 48 is formed by both the top portion 32 and the bottom portion 34 to enable sliding movement of the deadlatch plunger 18 within a corresponding channel along the direction 26. In the illustrative embodiment, a locator 50 extends from the top portion 32 and is configured to locate the spring 30 by insertion of the locator 50 into an open end of the spring 30. In another embodiment, the spring 30 is fixedly coupled to the locator. The top portion further includes an aperture 52 which enables connection of the current measuring circuit board 46 to a control circuit through a wire assembly 54. In one embodiment, the wire assembly 54 includes a retractable coiled wire 55 which extends and retracts as necessary to adapt to movement of the deadlatch plunger 18. In another embodiment, a wireless connection is made between the circuit board 46 and the control circuit, such as controller 64.

The flexible PCBA 44 includes one or more conductors configured to couple to magnetic sensing devices such as a first Hall effect device 56 and to a second Hall effect device 58, which are separated by a distance "d". In one embodiment, each of the Hall effect devices 56 and 58 is a Hall effect switch that generates two output values depending on the strength of the magnetic field being sensed and provided by the magnetic field generating device 25. In one embodiment, the output value of a Hall effect switch is either on or off, wherein the on value is a high voltage state, and the off value is a low voltage state. In other embodiments, other types of magnetic field sensing devices are contemplated.

When the door is in the open position, the deadlatch plunger 18 is extended from the lock cylinder 12, and as the door is closed, the deadlatch plunger 18 is retracted into the lock cylinder 12. Since the first magnetic field sensor 56 and the second magnetic field sensor 58 are located in the deadlatch plunger 18, both sensors 56 and 58 move simultaneously along an axis defined with respect to a plane of the door when the strike plate is engaged as the door moves from the open position to the closed position.

One or more of the conductors of the flexible PCBA 44 are exposed to provide a contact connection with an exposed conductor or contact located on the current measuring circuit board 46. In the illustrative embodiment, the coupler 40 extends through an aperture of the flexible PCBA 44 to fixedly locate the flexible PCBA 44 within the chamber 42. In another embodiment, the electrical connection between the flexible PCBA 44 and the current measuring circuit board 46 is made by a hardwired connection which, in different embodiments, includes soldered connectors, stamped connectors, or compression connectors.

The Hall effect devices 56 and 58 are configured to detect the presence of a magnetic field. More specifically, in the illustrative embodiment, the Hall effect devices 56 and 58 sense the magnetic field provided by the magnetic field generating device 25. Since the Hall effect devices 56 and 58 are spaced by the distance d, one or more properties of the magnetic field sensed by each of the Hall effect switches are different (e.g., the amount/intensity of the magnetic field sensed). When the magnetic field generating device 25 is located at the door frame and the door is closed, the Hall effect device 56 senses a larger magnetic field than does the Hall effect device 58.

Figure 4:
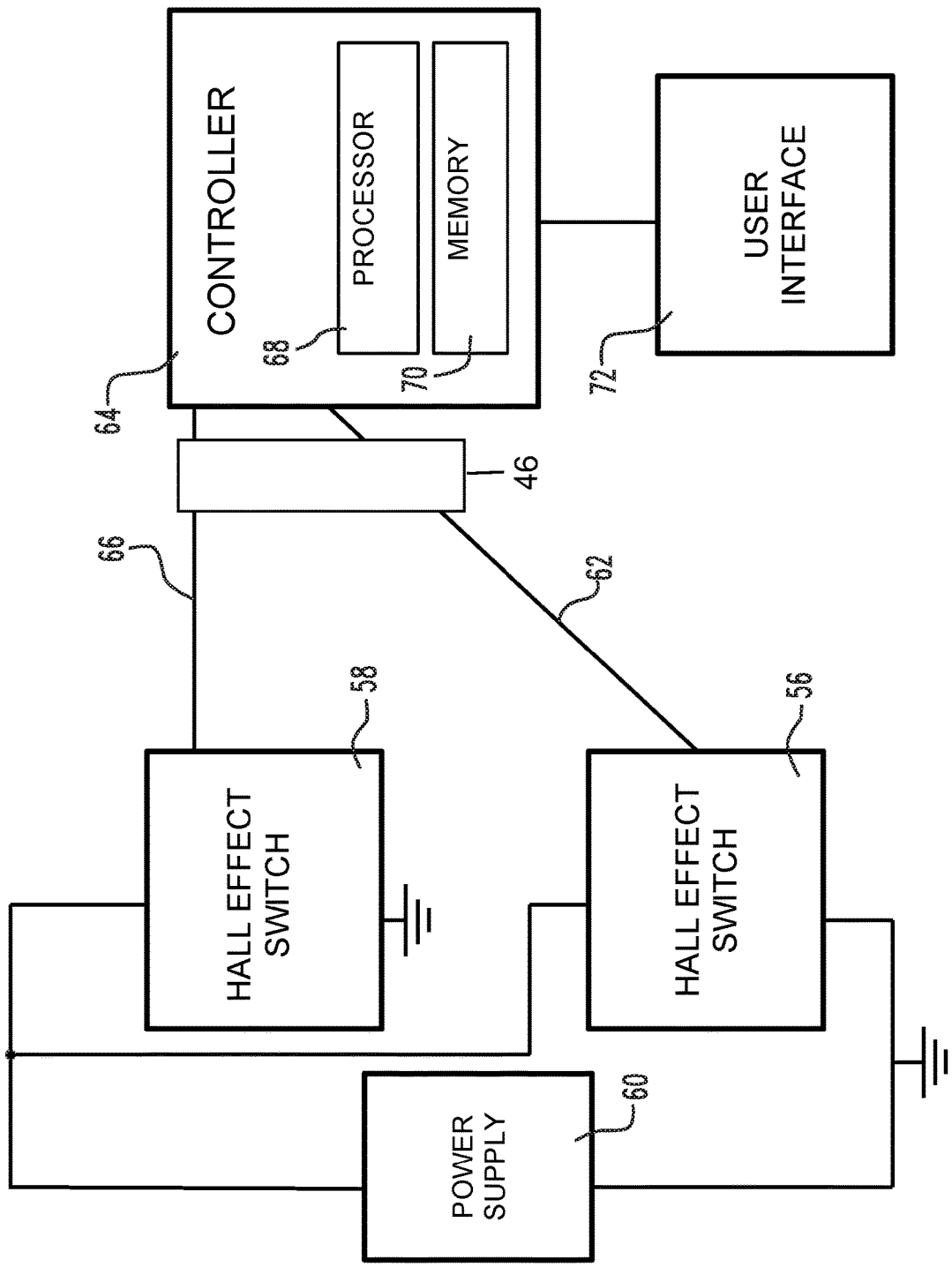
FIG. 4 is a circuit diagram for the latch assembly to determine door position.

Each of the Hall effect devices 56 and 58 is shown in a schematic diagram of FIG. 4 and is operatively connected to a power supply 60. The circuit board 46 is coupled between the controller 64 and the Hall effect devices 56 and 58. The Hall effect device 56 includes an output 62, which is coupled to a controller 64 through the circuit board 46. In one embodiment, the controller 64 is coupled to the wire assembly 54 and is located either within the lock assembly 10 or located externally to the lock assembly 10. The Hall effect device 58 includes an output 66 which is also operatively connected to the controller 64 through the circuit board 46. Upon sensing the magnetic field, either one or both of the switches 56 and 58 each respectively provides an output signal on the output 62 and/or the output 66. The controller 64 is operatively connected to the Hall effect devices 56 and 58 through the wire assembly 54.

The controller 64 includes a processor 68 and a memory 70, wherein the memory is configured to store program code or instructions configured to enable the processor 68 to determine the content of each of the outputs 62 and 66. In one embodiment, the controller is an analog to digital converter. Because each of the Hall effect devices 56 and 58 is configured to sense a different magnetic field intensity, the position of the door is determined as being either in a close position or an open position.

In one embodiment, the controller 64 is configured to determine the status of the door with respect to the door frame, as well as the occurrence of a fault state. The controller 64 determines one of three states for the door and/or the door lock including: an open position; a close position; and a fault state, also identified as a manipulation attack state. In the open position state, neither of the Hall effect devices 56 or 58 experiences a magnetic field sufficient to indicate that the door is open. In this state, each of the outputs 62 and 66 provides a low output, which is insufficient to indicate the presence of a detected magnetic field. In the close position state, the Hall effect device 56 experiences a magnetic field of sufficient force or magnitude to generate an output signal at the output 62. The Hall effect device 58 does not experience a magnetic field of sufficient force and consequently no output signal, or a signal having less amplitude than the signal at output 62, is generated at the output 66. In this closed position state, the output voltage at the output 62 is a high voltage value, while the output voltage value at the output 66 is a low voltage value. In a third state, or fault state, both of the Hall effect devices 56 and 58 experience a magnetic field of sufficient force to cause both of the outputs voltage values at the output 62 and the output 66 of be a high voltage value. The fault state is a result based on a tampering with the lock of one or more different types, including the use of an external magnet being used to try and defeat the normal functioning of the lock. In the fault state, both devices 56 and 58 have a high voltage output, where in a normal sensing condition one or the other of the devices 56 and 58 have a high voltage output.

In one embodiment, the controller 64 includes a processor 68 and a memory 70. The controller is configured to determine the states of the Hall effect devices including the first, second, and third states described above. The processor executes or otherwise relies upon computer software applications, components, programs, objects, modules, or data structures, etc. Software routines resident in the memory 70 are executed in response to the output signals received from the output 62 and the output 66. The memory 70, in different embodiments, is located within the controller 64 or is located externally to the controller 64. The executed software includes one or more specific applications, components, programs, objects, modules or sequence of instructions typically referred to as "program code". The program code includes one or more instructions located in the memory, or other storage devices, which determine the state of outputs of both of the Hall effect devices 56 and 58.

The controller 64 is operatively connected to a user interface 72, which is configured to provide an indication representative of the output of the Hall effect device 56 and the Hall effect device 58. The user interface 72, in different embodiments, includes a graphical user interface, one or more illumination devices, or one or more audible devices. The user interface 72 provides an indication of the outputs of the Hall effect switch 56 and the Hall effect switch 58. In one embodiment, the user interface 72 indicates various door conditions including one or more of: i) the door is open; ii) the door is closed; and iii) the fault state. In another embodiment, the user interface 72 is located at a central control station, where an operator monitors the states of a plurality of doors located throughout a facility or a part of the facility.

Figure 5:
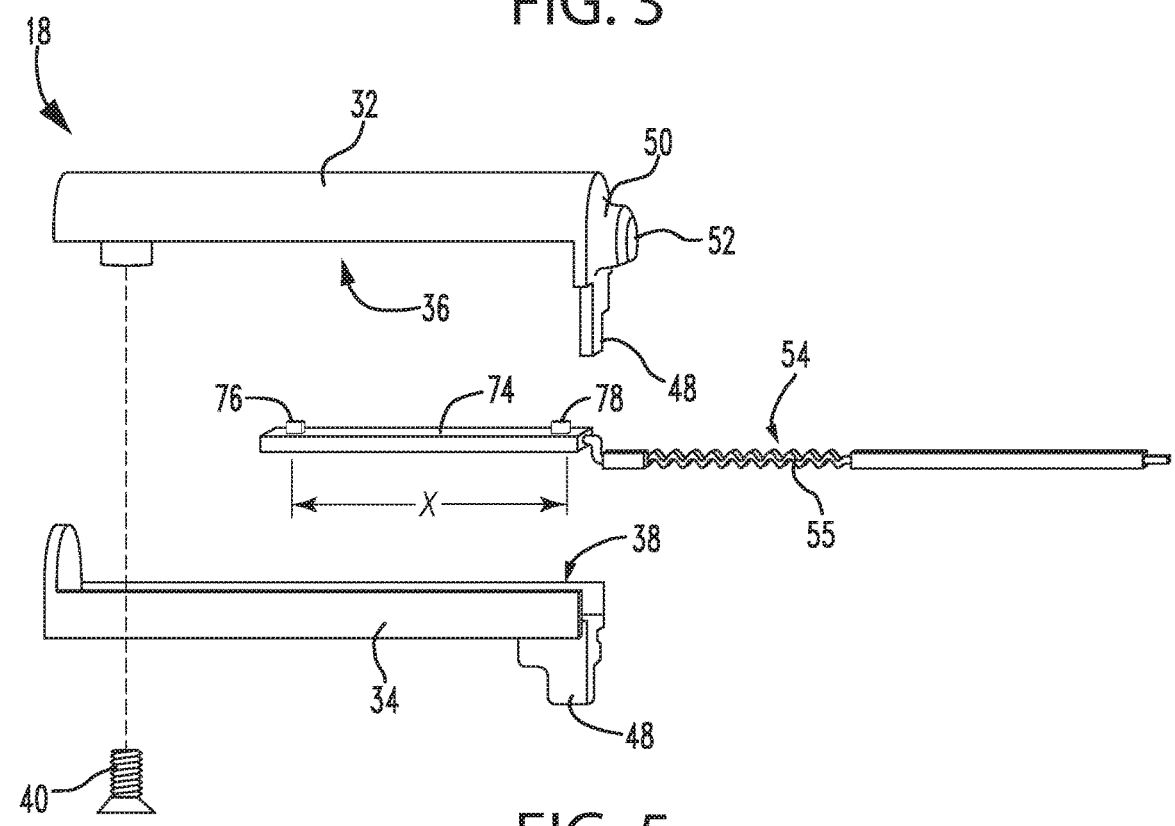
FIG. 5 an exploded view of another embodiment of a split deadlatch plunger assembly of FIG. 2.

FIG. 5 is an exploded view of another embodiment of a split deadlatch plunger assembly of FIG. 2. In this embodiment, the deadlatch plunger 18 includes the top portion 32 and the bottom portion 34, which are configured to define, respectively, the cavity 36 and the cavity 38 in a way similar to that described above in reference to FIG. 3. When the top portion 32 is coupled to the bottom portion 34 with the coupler 40, the enclosed chamber 42 (see FIG. 2) houses a current measuring circuit board 74. In this embodiment, the current measuring circuit board 74 includes a first Hall effect device 76 and a second Hall effect device 78, which are spaced apart by a distance "x" on the circuit board 74. This embodiment is configured to provide output signals in a manner similar to that described above with respect to the embodiment of FIGS. 3 and 4, and in one embodiment is used with the controller 64 of FIG. 4.

Figure 6:
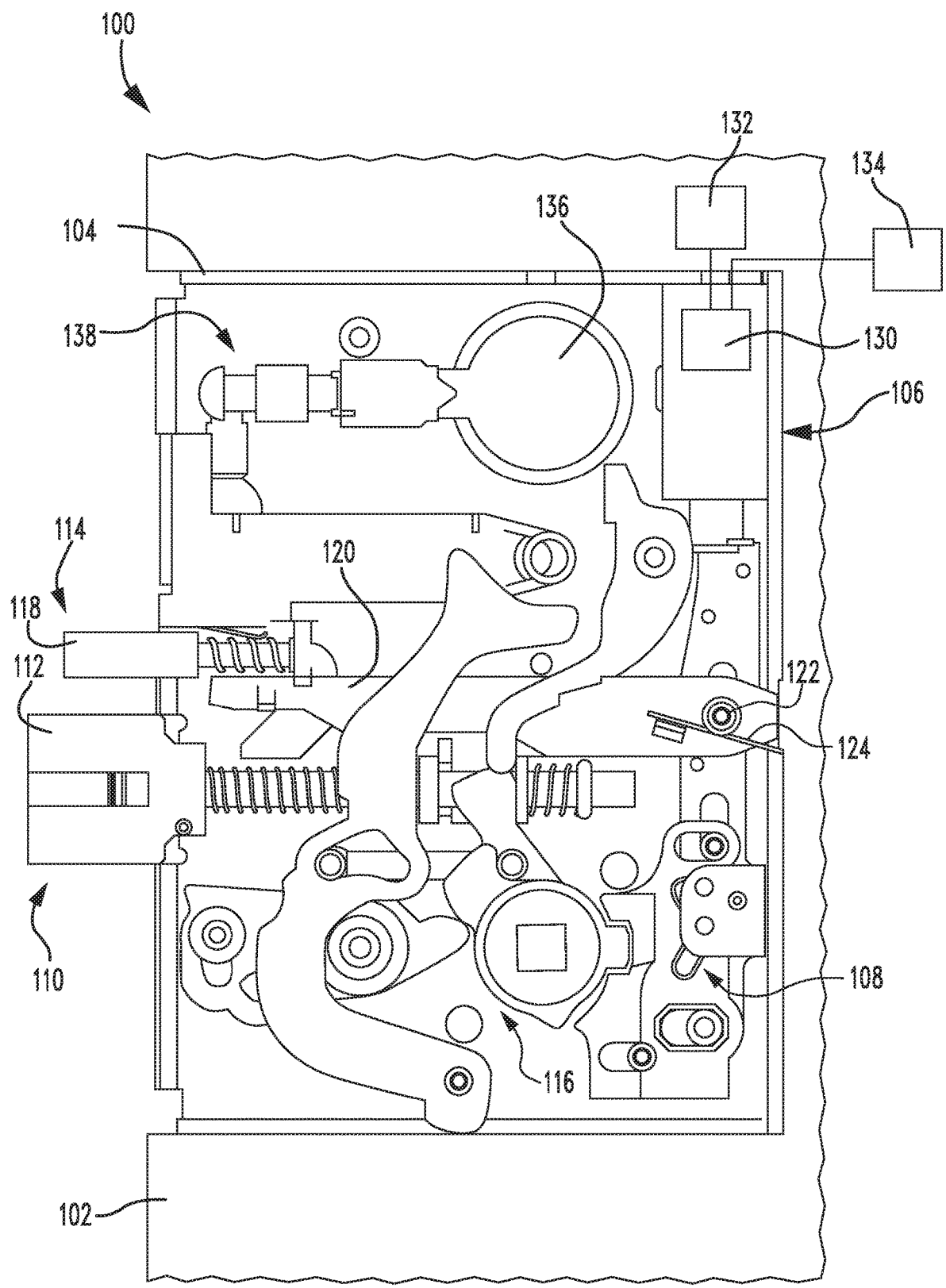
FIG. 6 is an elevational view of a mortise lock assembly.

FIG. 6 is an elevational view of a mortise lock assembly 100 configured for mounting in a door 102. The mortise lock assembly 100 includes a case 104 that houses a drive assembly 106, a locking member or catch 108 driven by the drive assembly 106, a latch assembly 110 including a retractable latch bolt 112, a deadlatch assembly 114 operable to deadlock the latch bolt 112 when the door 102 is closed, and a transmission assembly 116 connected to the latch assembly 110 and operable to retract the latch bolt 112. The lock assembly 100 further includes a cover plate (not illustrated) which retains components of the lock assembly 100 within the case 104.

The mortise lock assembly 100 may be installed in the door 102 having a secured or inner side and an unsecured or outer side. Additionally, one or more manual actuators such as handles, knobs, or levers (not illustrated) may be coupled to the transmission assembly 116 to move the latch assembly 110. In operation, the drive assembly 106 moves the catch 108 between a locking position and an unlocking position to define locked and unlocked states of the lock assembly 100. With the catch 108 in the unlocking position, an outer handle is free to rotate, and rotation of the outer handle is transmitted through the transmission assembly 116 to cause retraction of the latch assembly 110. When in the locking position, the catch 108 engages the transmission 116 such that rotation of the outer handle is prevented, and the outer handle is not operable to retract the latch assembly 110.

The deadlatch assembly 114 includes a deadlatch 118 slidingly mounted to the case 104, a deadlocking member 120 pivotably mounted on a post 122, and a biasing member such as a torsion spring 124 rotationally biasing the deadlatch 118 toward the transmission assembly 116. As the door 102 is closed, the deadlatch 118 is depressed to a retracted position via contact with the door frame. As the deadlatch 118 retracts, the spring 124 urges the deadlatch 118 to a blocking position, wherein the free end of the deadlatch 118 is aligned with the latch bolt 112. In this position, the deadlatch 118 prevents the latch bolt 112 from being forced inwardly by an externally-applied force, thereby deadlocking the latch bolt 112.

The lock assembly 100 also includes a controller 130 which controls operation of the drive assembly 106 to move the catch 108 between the locking and unlocking positions. The controller 130 may be in communication with a user interface 132, such as a keypad or credential reader which may be mounted on or adjacent to the door 102. The controller 130 may additionally, or alternatively, be in wired or wireless communication with a control system 134. In one or more embodiments, the control system includes a remote control system or an access control management system. In operation, the controller 130 may maintain the lock assembly 100 in the locked state, and may operate the drive assembly to move the catch 108 to the unlocked position in response to an authorized unlock command from the user interface 132 and/or the control system 134. The lock assembly 100 further includes an aperture 136 which is configured to contain a key cylinder (not shown). A screw assembly 138 engages the key cylinder to hold the cylinder within the aperture 136.

Figure 7:
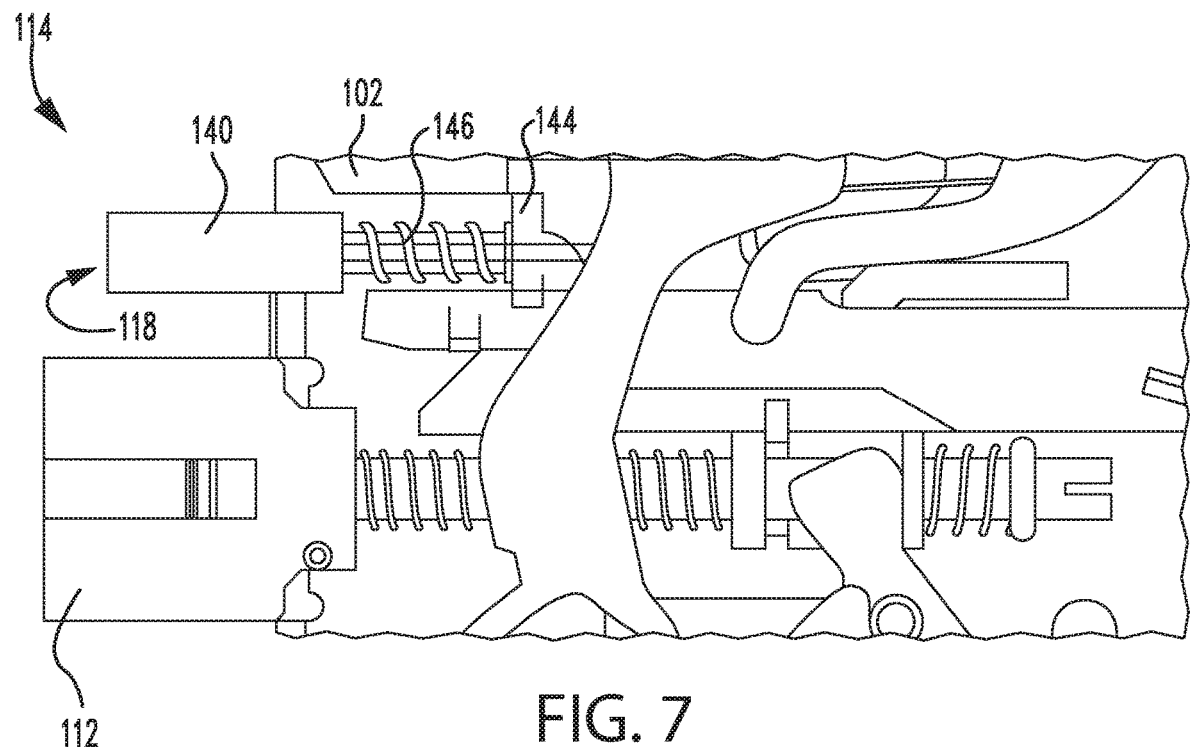
FIG. 7 is a partial view of the mortise lock assembly of FIG. 6 including a deadlatch assembly and a latch bolt.
Figure 8:
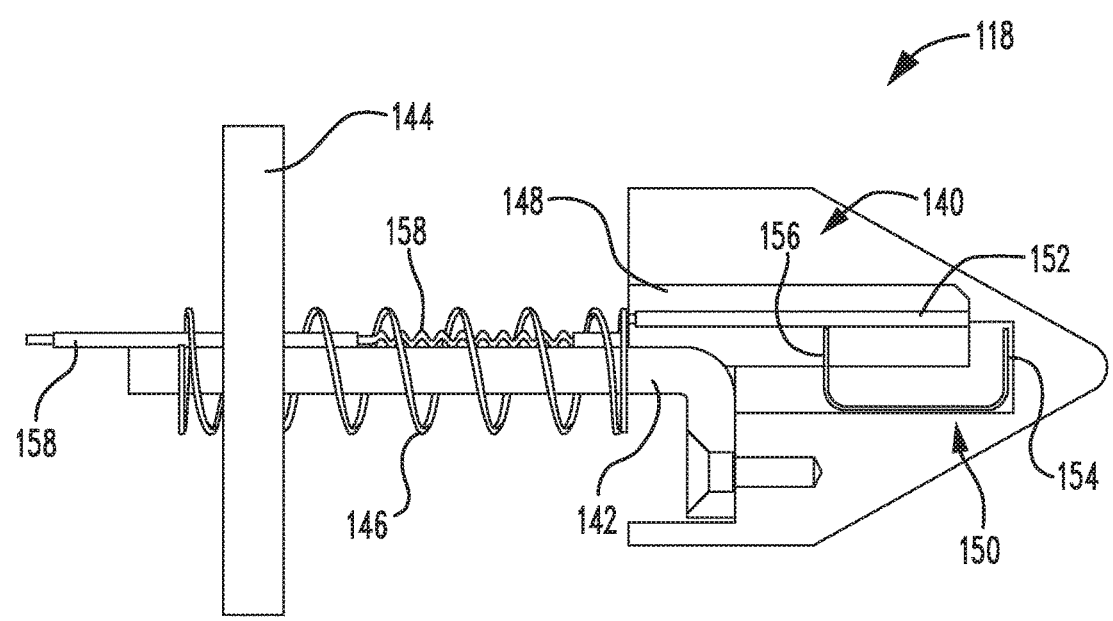
FIG. 8 is a partial sectional view of the deadlatch assembly of FIG. 7.

FIG. 7 illustrates a partial sectional view of the mortise lock assembly 100 of FIG. 6 including the latch bolt 112 and the deadlatch 118. The deadlatch 118 includes a deadlatch plunger 140 (see also FIG. 8) operatively connected to an arm 142 that slidingly engages a support 144. A resilient member 146, or spring, surrounds the arm 142 and when uncompressed, extends the plunger 140 from the case 104.

The plunger 140 includes a cavity 148, which is configured to support a flexible PCBA 150 and a current measuring PCBA 152. The flexible PCBA 150 includes a first Hall effect device 154 and a second Hall effect device 156 configured to operate in a manner similar to that described above with respect to FIGS. 3 and 4. The flexible PCBA 150 is electrically coupled to the current measuring PCBA 152 as previously described, and includes a wiring assembly 158 which extends from the plunger 140 to the controller 130 of FIG. 6, which provides the functions of the controller 64 as described with respect to FIG. 4. In other embodiments, the PCBA 150 and PCBA 152 include other circuit board which are partly flexible or rigid.

In another embodiment, the deadlatch 118 does not include the flexible PCBA 150. Instead, the current measuring PCBA 152 includes Hall effect devices 154 and 156 similar to those described with respect to FIG. 5. In this embodiment, the functions provided by the first and second Hall effect devices 154 and 156 are those as described in reference to FIGS. 4 and 5.

Figure 9:
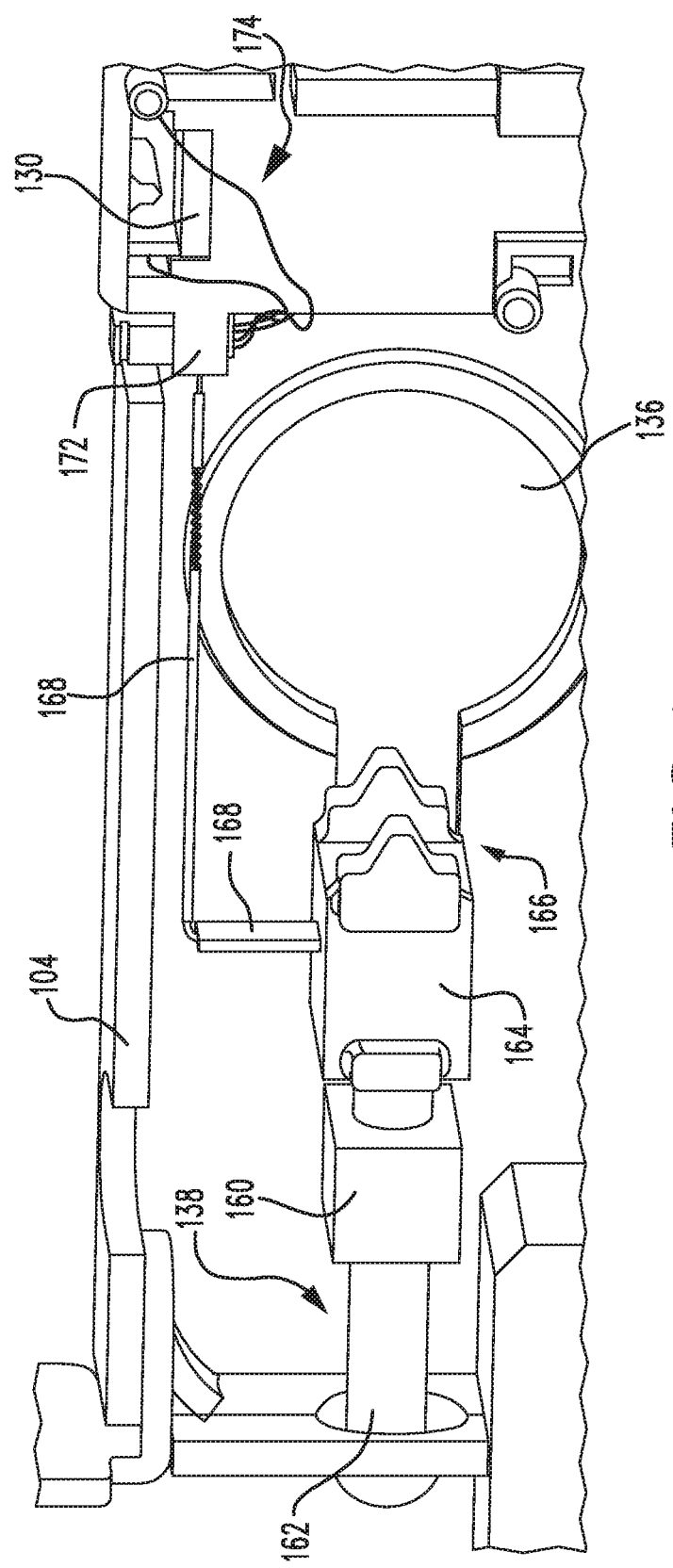
FIG. 9 is an elevational view of a portion of the mortise lock assembly of FIG. 6.
Figure 11:
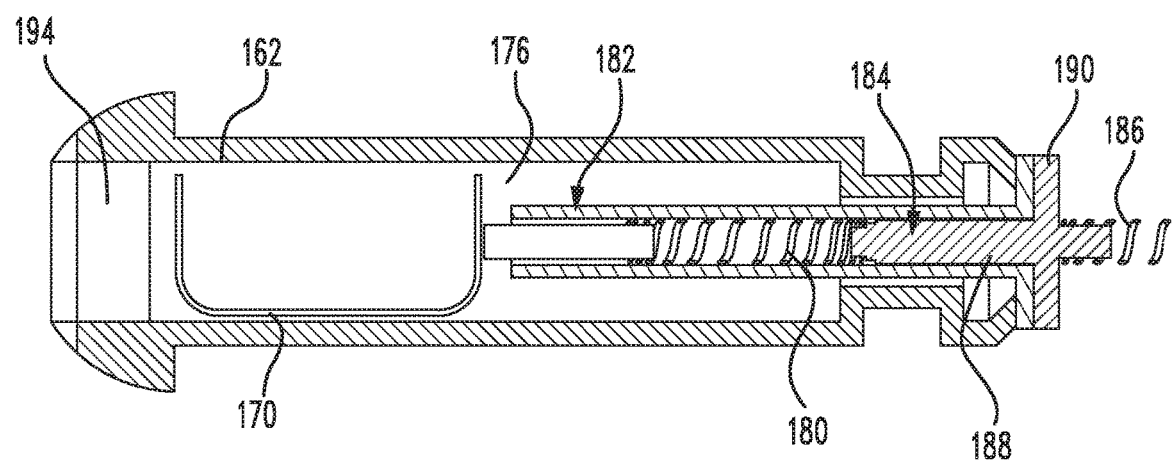
FIG. 11 is a sectional view of a door position sensor screw assembly located in the case of the mortise lock assembly of FIG. 6.
Figure 12:
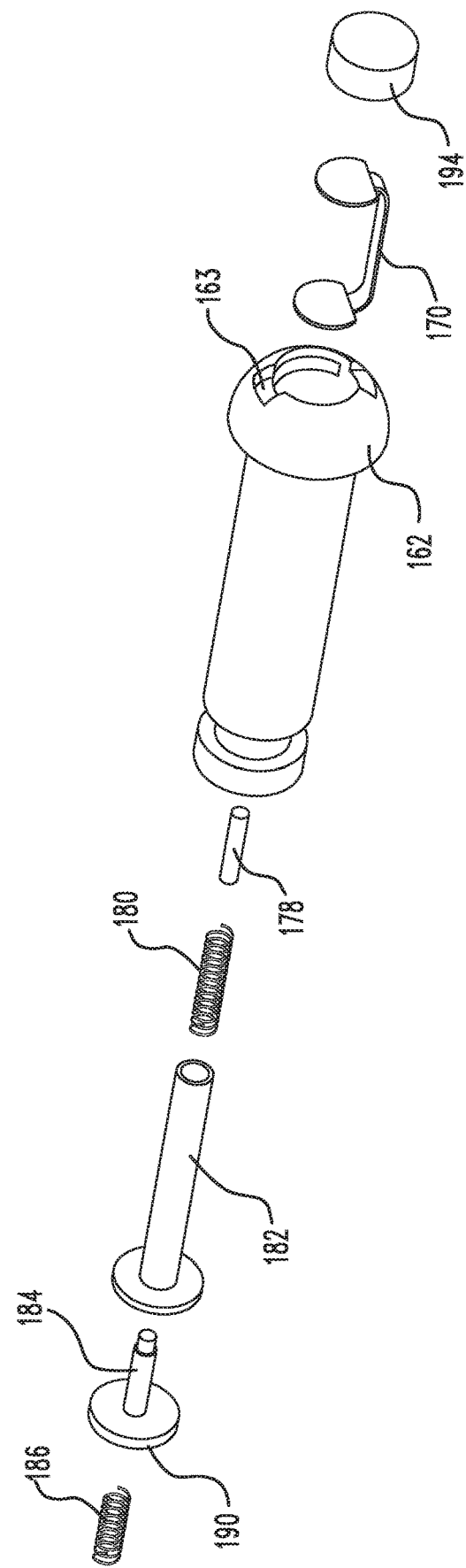
FIG. 12 is an exploded perspective view of the embodiment of the door position sensor screw assembly of FIG. 11.

FIG. 9 illustrates an elevational view of a portion of the mortise lock assembly 100 of FIG. 6 including the screw assembly 138 that is configured to fix a lock cylinder within the aperture 136. The screw assembly 138 includes a screw plate 160 which is at a fixed location with respect to the housing 104. The screw plate 160 receives a screw 162 through an internally threaded hole, such that rotation of the screw 162 with a screw drive 163 (see FIG. 12) adjusts the position of a screw retainer 164 horizontally as illustrated. The screw drive 163 is illustrated in FIG. 11. The screw retainer 164 includes a pair of V-shaped lugs 166. As illustrated in FIG. 9, the screw retainer 164 is located in a leftmost position to enable the key cylinder to be located in the aperture 136. Rotation of the screw 162 moves the screw retainer 164 towards the right such that the V-shaped lugs 166 engage and hold the key cylinder in place which prevents rotational movement of the key cylinder when a key is turned.

Figure 10:
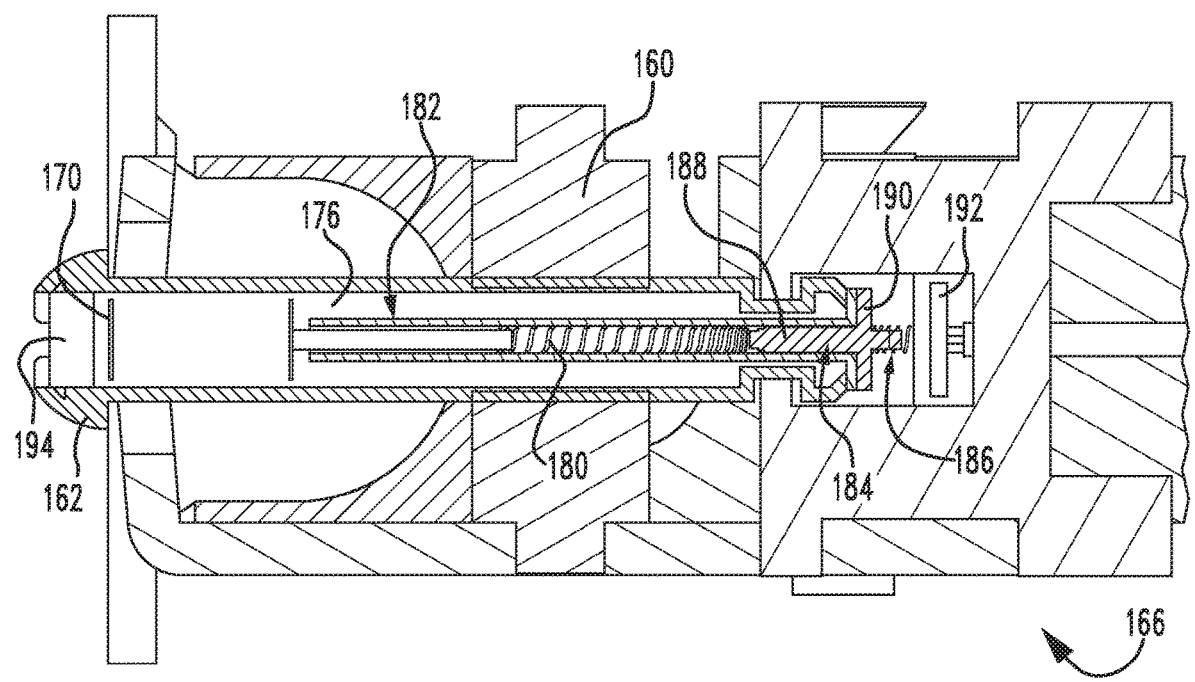
FIG. 10 is a sectional view of a top portion of the mortise lock assembly of FIG. 6.

A wiring harness 168 is fixedly coupled to the screw retainer 164 and couples a flexible PCBA 170 (see FIGS. 10, 11, and 12) to the controller 130. The wiring harness 168 extends from the screw retainer 164 to a support 172, which supports an end of the wiring harness 168 for connection to the controller 130 through connections 174. As seen in FIGS. 10 and 11, the screw 162 includes a cavity 176 configured to house the flexible PCBA 170, as well as a first conductor 178, a first conductor spring 180, an insulator 182, a second conductor 184, and a second conductor spring 186.

The first conductor spring 180 extends between the first conductor 178 and the second conductor 184 within a channel defined by the insulator 182 at a first end of the channel. The first conductor spring 180 provides sufficient biasing force to maintain an electrical connection between the first conductor 178 and the flexible PCBA 170, which includes an exposed conductor to make the connection. In other embodiments, the PCBA 170 includes other circuit board which are partly flexible or rigid. The electrical connection with the PCBA 170 is made by first conductor 178, the first conductor spring 180 and the second conductor 184, each of which are located within a channel provided by the insulator 182. The second conductor 184 includes a shaft 188, which is positioned within the channel of the insulator 182 at a second end of the channel, and a ring 190 which provides a support surface for the second conductor spring 186. One end of the second conductor spring 186 engages the ring 190 and the other end contacts a fixed portion 192 of the wiring harness 168. As the screw 162 is rotated to move the lugs 166 into position with the key cylinder, the spring tension provided by the first and second conductor springs increases to maintain the electrical connection between the flexible PCBA 170 and the wiring harness 168. In other embodiments, the electrical connection between the flexible PCBA 170 and wiring harness is made by hard wired connects as opposed to the applied electrical contact made the conductor springs. An end cap 194 is located within the cavity 176 of the screw 162 to insure the parts located within the cavity 176 remain in place as the screw 162 is located to fix the position of the key cylinder. The wiring harness 168 is operatively connected to the controller as described herein.

While the invention has been illustrated and described in detail in the drawings and foregoing description, the same is to be considered as illustrative and not restrictive in character, it being understood that only the preferred embodiments have been shown and described and that all changes and modifications that come within the spirit of the inventions are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

What is claimed is:

1. A lock assembly for a door, comprising:
    a deadlatch assembly including a first magnetic field sensor and a second magnetic field sensor spaced from the first magnetic field sensor, wherein the deadlatch assembly is configured to move from an extended position to a retracted position along an axis, and wherein the first magnetic field sensor and the second magnetic field sensor are offset from one another along the axis;
    a controller operatively connected to the first magnetic field sensor and the second magnetic field sensor wherein the controller is configured to execute stored program instructions to:
        determine a first magnetic field signal strength provided by a magnetic field based on data generated by the first magnetic field sensor;
        determine a second magnetic field signal strength provided by the magnetic field based on data generated by the second magnetic field sensor; and
        determine the status of one of the lock assembly or the door based on the first magnetic field signal strength and the second magnetic field strength, wherein the status includes an open position, a close position, and a fault condition;
    wherein to determine the status of one of the lock assembly of the door based on the first magnetic field signal strength and the second magnetic field strength comprises determining the fault condition when the first magnetic field signal strength exceeds a first threshold value and the second magnetic field strength signal exceeds a second threshold value; and wherein the first magnetic field signal strength is greater than the second magnetic field signal strength when the door is in the closed position and the fault condition is not present.

2. The lock assembly of claim 1, wherein the deadlatch assembly includes a deadlatch plunger defining a cavity, wherein the first magnetic field sensor and the second magnetic field sensor are located in the cavity.

3. The lock assembly of claim 2, further comprising a flexible printed circuit board assembly (PCBA); and
wherein the first magnetic field sensor and the second magnetic field sensor are located on the flexible PCBA.

4. The lock assembly of claim 3, further comprising a current measuring circuit board operatively connected to the flexible PCBA.

5. The lock assembly of claim 4, wherein the deadlatch assembly includes a first part and a second part, wherein the first part and the second part cooperatively define the cavity.

6. The lock assembly of claim 5, further comprising a wiring harness, wherein the wiring harness is operatively connected to a current measuring circuit board and extends through an aperture defined by one or both of the first part and the second part.

7. The lock assembly of claim 6, wherein the flexible PCBA is electrically coupled to the current measuring circuit board with an exposed electrical contact configured to make a contact connection with an exposed conductor located on the current measuring circuit board.

8. The lock assembly of claim 7, further comprising a magnetic field generating device adapted to provide the magnetic field.

9. The lock assembly of claim 6, wherein the wiring harness includes a retractable coiled wire.

10. The lock assembly of claim 4, wherein the current measuring circuit board is located in the cavity.

11. The lock assembly of claim 9, further comprising spring and an arm operatively connected to the deadlatch plunger, wherein the arm extends through the spring.

12. The lock assembly of claim 11, further comprising a wiring harness, wherein the wiring harness is operatively connected to the current measuring circuit board and extends through the spring.

13. The lock assembly of claim 1, wherein to determine the status of one of the lock assembly or the door based on the first magnetic field signal strength and the second magnetic field strength comprises:
determining the open position when the first magnetic field signal strength falls below the first threshold value and the second magnetic field strength signal falls below the second threshold value; and
determining the closed position when the first magnetic field signal strength exceeds the first threshold value and the second magnetic field strength signal falls below the second threshold value.

14. The lock assembly for a door, comprising:
a deadlatch assembly including a first magnetic field sensor and a second magnetic field sensor spaced from the first magnetic field sensor, wherein the deadlatch assembly is configured to move from an extended position to a retracted position;
a screw assembly configured to retain a key cylinder, wherein the screw assembly includes a screw defining a channel;
a flexible printed circuit board assembly (PCBA) located in the channel of the screw, the flexible PCBA including the first magnetic field sensor located at a first position closest to a screw drive of the screw assembly and the second magnetic field sensor located at a second position further from the screw drive than the first magnetic field sensor; and
a controller operatively connected to the first magnetic field sensor and the second magnetic field sensor wherein the controller is configured to execute stored program instructions to:
determine a first magnetic field signal strength provided by a magnetic field based on data generated by the first magnetic field sensor;
determine a second magnetic field signal strength provided by the magnetic field based on data generated by the second magnetic field sensor; and
determine the status of one of the lock assembly of the door based on the first magnetic field signal strength and the second magnetic field strength, wherein the status includes an open position, a closed position, and a fault condition.

15. The lock assembly of claim 14, wherein the screw assembly includes a conductor and a conductor spring located in the channel of the screw, wherein the conductor spring biases the conductor toward the flexible PCBA to provide an electrical contact.

16. The lock assembly of claim 15, further comprising a current measuring PCBA disposed outside the screw, wherein the conductor provides an electrical connection with the current measuring PCBA.

17. The lock assembly of claim 16, wherein the conductor includes a first conductor located in the channel of the screw, a second conductor located at least partially external to the screw, and a second conductor spring disposed between the second conductor and the current measuring PCBA configured to make electrical contact with the current measuring PCBA.

18. A method of determining the position of a door with respect to a door frame, the method comprising:
moving a first magnetic field sensor and a second magnetic field sensor simultaneously along an axis defined with respect to a plane of the door, wherein the first magnetic field sensor and the second magnetic field sensor are offset from one another along the axis;
identifying a first magnetic field with the first magnetic field sensor and identifying a second magnetic field with the second magnetic field sensor; and
providing an indicator based on the identified first magnetic field and the identified second magnetic field, wherein the indicator shows one of an open door position and a close door position;
wherein the indicator shows the open door position in response to the first magnetic field falling below a first threshold and the second magnetic field falling below a second threshold;
wherein the indicator shows the closed door position in response to the first magnetic field exceeding the first threshold and the second magnetic field falling below the second threshold; and
wherein the indicator shows a fault condition in response to the first magnetic field exceeding the first threshold and the second magnetic field exceeding the second threshold.

19. The method of claim 18, wherein the providing step the indicator shows a fault condition.

20. The method of claim 18, wherein the moving step comprises moving the first magnetic field sensor and the second magnetic field sensor simultaneously with a deadlatch, wherein the deadlatch is spring biased to extend from the door at a first position and the deadlatch is retracted into the door at a second position.

21. The method of claim 20, wherein in the first position the first magnetic field sensor senses a first magnetic field and the second magnetic field sensor senses a second magnetic field less than the first magnetic field.

22. The method of claim 20, wherein in one of the first position and the second position, the first magnetic field sensor senses a first magnetic field and the second magnetic field sensor senses a second magnetic field substantially the same as the first magnetic field.

23. A method of determining a condition of a door mounted in a door frame having a magnetic field generator mounted therein, the method comprising:

generating a first signal by a first magnetic field sensor, wherein the first magnetic field sensor is mounted to a lock mechanism including a bolt operable to move along an axis between an extended position and a retracted position;

generating a second signal by a second magnetic field sensor, wherein the second magnetic field sensor is mounted to the lock mechanism and is offset from the first magnetic field sensor along the axis; and determining the condition of the door based upon the first signal and the second signal;

wherein determining the condition of the door based upon the first signal and the second signal comprises determining a tamper condition in response to the first signal exceeding a first threshold and the second signal exceeding a second threshold; and wherein the first magnetic field signal strength is greater than the second magnetic field signal strength when the door is in a door closed condition and the tamper condition is not present.

24. The method of claim 23, wherein determining the condition of the door based upon the first signal and the second signal comprises:

determining a door open condition in response to the first signal falling below the first threshold and the second signal falling below the second threshold; and determining the door closed condition in response to the first signal exceeding the first threshold and the second signal falling below the second threshold.

25. The method of claim 23, wherein each of the first sensor and the second sensor is mounted to the bolt.

* * * * *